United States Patent [19]

Yokouchi et al.

[11] Patent Number: 4,704,658
[45] Date of Patent: Nov. 3, 1987

[54] EVAPORATION COOLING MODULE FOR SEMICONDUCTOR DEVICES

[75] Inventors: Kishio Yokouchi, Zama; Yuichi Suzuki, Sagamihara; Koichi Niwa, Tama, all of Japan

[73] Assignee: Fujitsu Limited, Kawasaki, Japan

[21] Appl. No.: 857,303

[22] Filed: Apr. 30, 1986

[30] Foreign Application Priority Data

Apr. 30, 1985 [JP] Japan ................................. 60-92511
Oct. 9, 1985 [JP] Japan ................................ 60-225211

[51] Int. Cl.⁴ .......................... H02B 1/00; H05K 7/20
[52] U.S. Cl. .................................. 361/385; 165/104.33
[58] Field of Search ................... 361/385; 165/104.29, 165/104.19, 104.21, 104.33

[56] References Cited

U.S. PATENT DOCUMENTS

| | | | |
|---|---|---|---|
| 3,270,250 | 8/1966 | Davis | 165/104.33 |
| 3,489,207 | 1/1970 | Miller | 165/104.33 |
| 3,512,582 | 5/1970 | Chu et al. | 361/385 |
| 4,572,286 | 2/1986 | Fujii et al. | 361/385 |
| 4,619,316 | 10/1986 | Nakayama et al. | 361/385 |

Primary Examiner—Roy N. Envall, Jr.
Attorney, Agent, or Firm—Staas & Halsey

[57] ABSTRACT

An evaporation cooling module for cooling plural semiconductor chips bonded on circuit boards immersed in a coolant within the module employs immersed heat exchangers associated with bubble traps which trap gaseous bubbles of evaporated coolant and maintain same in contact with the heat exchanger for improved reliquification efficiency. Bubble guides, which may be mounted to the circuit boards intermediate vertically spaced rows of semiconductor chips, guide gaseous bubbles of the evaporated coolant to the bubble trap, producing local convection coolant currents affording increased reliquification efficiency by released gases and improved temperature uniformity of the plural semiconductor chips. Use of immersed heat exchangers avoids decrease in reliquification efficiency since isolated therefrom. Bubble traps of predetermined porosity permit preferential separation of gaseous bubbles of the evaporated coolant and the undesired released gases.

24 Claims, 11 Drawing Figures

EVAPORATION COOLING MODULE FOR SEMICONDUCTOR DEVICES

BACKGROUND OF THE INVENTION

1. Field of the Invention

The present invention relates to an evaporation cooling module for semiconductor devices wherein plural such semiconductor devices, or chips, mounted on a circuit board are immersed in the coolant liquid so as to be cooled by evaporation of the liquid coolant, one or more heat exchangers immersed in the liquid coolant serving to reliquify the evaporated coolant gas; more particularly, the invention relates to an improved such module having bubble traps for collecting bubbles of evaporated coolant gas and maintaining same in close contact with respectively associated heat exchangers for achieving more effective and efficient reliquification, and bubble guides for guiding gaseous bubbles of the evaporated coolant, produced in passing over corresponding groups of the IC chips, toward the respectively associated bubble traps.

2. State of the Prior Art

The use of liquid cooling modules for cooling plural heated elements is known in the prior art, as illustrated by the following, identified publications. Whereas most of the publications relate to cooling plural packaged devices immersed in the coolant, the publications are applicable as well, in principle, with respect to cooling semiconductor chips which are immersed directly in the coolant.

"Dielectric Bath Promotes Togetherness in IC's" by R. R. Weirather et al., ELECTRONICS, Apr. 17, 1967, describes fundamental principles of cooling plural substrates immersed in a liquid cooling container.

"Better Component Cooling Through Multi Fluid Boiling" by Sevgin Oktay, ELECTRONIC PACKAGING AND PRODUCTION, May, 1970, discloses the fundamental arrangement of cooling a first liquid coolant in which the heated elements are immersed, by a second coolant.

U.S. Pat. No. 3,741,292 to AKALAU ET AL., issued June 26, 1973, discloses a module comprising heat generating components which are exposed within a container, which contains a liquid having a low temperature boiling point.

U.S. Pat. No. 3,851,221 to BEAULIEU ET AL., issued Nov. 26, 1974, discloses a cooling arrangement in which a package of plural, stacked substrates is immersed in a coolant.

Japanese laid-open publications No. 47-37181 to YANATORI, No. 49-98583 to DAIKOKU, and No. 55-91197 to FUJII, in general, disclose a bubble directing guide plate disposed within a liquid coolant for directing gaseous bubbles of the evaporated coolant to travel upwardly along the inner surface of a sealed structure containing the coolant, for increasing the efficiency of cooling.

Techniques for cooling circuit elements of electronic equipment have become increasingly important as the packing density of the elements within the equipment has increased. Various types of cooling methods have been proposed, improvements therein proceeding from air cooling to liquid cooling in view of the greater heat removal afforded by the latter. Early such cooling systems employed a cooling pipe which was coupled to a circuit board or directly to the heat generating elements (e.g., semiconductor chips or other electrical devices which dissipate heat during operation). As the packing density of the elements and the corresponding heat dissipation increased, later arrangements provided for immersing the circuit board itself into a liquid coolant.

In the early stages of the development of liquid immersion cooling techniques, each circuit element was encapsulated in an hermetic case and then mounted on the circuit board, prior to immersion into the liquid coolant. Because of improvements in surface passivation techniques for circuit elements, it has become possible to immerse them directly into the liquid coolant without packaging them in a hermetic case, further increasing the cooling efficiency and the packing density. For example, in computers employing numerous integrated circuits (IC's), it has become possible to mount plural IC chips directly on a ceramic circuit board, without packaging or hermetic sealing of the IC's, and to immerse the latter directly in a liquid coolant. It is also known to bond a group of plural semiconductor chips on a subcircuit board which in turn is bonded to a main, or mother, circuit board, the subcircuit board and its associated plurality of chips being termed, collectively, a chip. Such chips in the form of a subcircuit board and related chips mounted thereon as well are encompassed within the scope of the present invention—i.e., in the following, the words "chip" and "IC chips" encompass either an individual chip or a subcircuit board having a plurality of IC chips mounted thereon.

As is known, liquid immersion cooling may be performed either by evaporation, or evaporative, cooling in which the coolant is caused to boil at the surface of the heat dissipating element, and convection cooling in which the coolant remains in a liquid state and is caused to flow over and around the heat dissipating element. Evaporation cooling is recognized to achieve greater cooling efficiency, although it permits the temperature of the heat dissipating element to be somewhat higher than with convection cooling, other factors remaining equal. However, by choosing a liquid coolant having a sufficiently low boiling point, the heat dissipating element may be maintained at a sufficiently low temperature thereby to assure normal operating conditions. For example, IC chips typically are made to withstand an operating temperature of 80° C.; thus, by using a liquid coolant having a boiling point less than 80° C., evaporation cooling may be employed, permitting the utilization of its greater efficiency while maintaining the requisite operating temperature of the IC chips.

Liquid coolants used for liquid immersion cooling must be noncorrosive and electrically insulating. Suitable such coolants are Freon ($C_2Cl_3F_3$) which has a boiling point of approximately 49° C., and various fluorocarbons such as $C_5F_{12}$ having a boiling point of approximately 30° C., and $C_6F_{14}$ having a boiling point of approximately 56° C.

In practical operation of a cooling chamber, or module, employing evaporation cooling, the evaporated coolant gas must be reliquified and circulated back as a liquid to the cooling chamber. The efficiency with which the reliquification of the coolant gas is achieved therefore is an important factor affecting the overall efficiency of the liquid coolant system. Typically, the evaporated coolant gas is reliquified by a second coolant, such as chilled water, which passes through a heat exchanger over which the evaporated coolant gas flows. FIG. 1 herein illustrates schematically a conventional liquid immersion cooling chamber 1. Case 1 houses a plurality of circuit boards 4 typically of ceramic material, each having mounted thereon plural IC chips 3, which are supported by corresponding connectors 2 and immersed within a liquid coolant 5. The heat dissipating IC chips 3 are cooled by the liquid coolant 5 which in turn is caused to evaporate; the resultant gas collects in the space 7 above the surface of the liquid coolant 5 and therein is caused to be reliquified by interaction with the heat exchanger 6.

The general structural arrangement illustrated in FIG. 1, in which the heat exchanger 6 occupies the space 7 above the surface of the liquid coolant 5 for contacting the evaporated coolant gas, is known to provide improved efficiency as compared with systems in which a heat exchanger is immersed within the liquid coolant. However, various problems are encountered in such systems, which result in gradual reduction of the reliquification efficiency and ultimately loss of the cooling effect and correspondingly an unexpectedly short cooling system life.

Among the reasons believed to contribute to the unacceptably short coolant system life is the fact that in such liquid immersion cooling systems, many elements are immersed in the coolant including IC chips, circuit boards, terminal boards forming portions of the cooling chamber walls, and the like. Particularly, various gases, primarily air and water vapor captured as moisture in the various elements, are released from those elements and travel through the coolant 5 into the upper gas space 7 in which the heat exchanger 6 is mounted. Since those released gases are not reliquified by the heat exchanger, they accumulate and surround the heat exchanger 6, reducing its reliquification efficiency. It is also expected that slow leaks may occur in such cooling chambers. Reduction of the reliquification efficiency ultimately may result in an unacceptable increase in the internal operating temperatures within the chamber which, of course, is unacceptable in view of the required maintenance of predetermined operating temperatures of the various devices, e.g., ceramics, semiconductors, insulating materials and so forth, sealed within the chamber. It appears impossible with present state-of-the-art technology either to effect perfect evacuation of the undesired, released gases within the chamber, or to avoid leaks of the chamber so as to insure that only the desired coolant, either in its liquid or gaseous state, is present within the chamber. Therefore, degassing must be performed on a repeated, periodic schedule, for removal of such undesired, released gases in order to maintain high cooling efficiency.

Whereas the problem of reduced reliquification efficiency is avoided by systems in which the heat exchanger is immersed in the liquid coolant, the coolant gas must be reliquified by the coolant liquid itself with the result that the reliquification efficiency again is reduced. Moreover, since the heat dissipating elements are cooled merely by contact with the convection flow of liquid coolant thereover, the liquid coolant must be maintained at a lower temperature than its boiling point since the benefits of evaporation cooling are lost.

SUMMARY OF THE INVENTION

Accordingly, it is an object of the present invention to overcome these and other defects of prior art liquid immersion cooling systems for semiconductor devices and particularly to provide improved such systems having increased total efficiency of operation.

Another object of the present invention is to provide a cooling module of improved structure for achieving liquid immersion cooling of circuit boards, which affords high cooling efficiency and simplified maintenance.

Still another object of the present invention is to provide a liquid immersion cooling module of increased reliability.

These and other objects of the present invention are achieved by the provision, in a liquid immersion cooling module containing a liquid coolant therein and wherein the heat exchanger is immersed within the coolant liquid, of a bubble trap which is positioned in relationship to an associated heat exchanger for trapping evaporated gaseous bubbles of the evaporated coolant and accumulating same around the associated heat exchanger. The bubble trap is fabricated of a porous metal, having a porosity within a range hereinafter specified and explained, which enables the trap selectively to trap the evaporated coolant bubbles and accumulate same around the heat exchanger while permitting the released gases, such as air and water vapor, to pass through the trap. The bubble traps may assume any of various configurations, as hereinafter disclosed.

Accordingly, through the provision of the bubble traps of the present invention, the gaseous bubbles of evaporated coolant are maintained in intimate contact with the heat exchanger, thereby affording efficient reliquification functions, while the heat exchanger nevertheless remains immersed in the coolant and thus relatively free of the undesired, released gases which inevitably develop within the system—and which, if permitted to accumulate around the heat exchanger as occurs in prior art structures, decreases cooling efficiency. Accordingly, cooling modules in accordance with the present invention maintain high cooling efficiency for extended periods of time, avoiding the periodic degassing operations required with prior art cooling chambers and affording ease of maintenance relative to such prior art modules.

The cooling chambers, or modules, of the present invention furthermore include improved structures termed bubble guides which function in cooperation with the bubble traps and heat exchangers to guide the gaseous coolant bubbles into the bubble traps, thereby to assure that most of the bubbles of evaporated coolant are reliquified before reaching the surface of the liquid coolant. The bubble guides, moreover, produce a local circulation flow of the liquid coolant between the heat dissipating devices and the heat exchangers, contributing to increased cooling efficiency and improved uniformity of temperature over the entire surface of the immersed circuit board and thus of the devices mounted thereon.

Cooling modules of the type here contemplated require means for electrically connecting the circuit boards and/or elements mounted on the circuit boards to exterior circuits and related equipment. Accordingly, the cooling module of the present invention is structured to accommodate this requirement. In one embodiment, hermetically sealed contact pins extend from the inside to the outside surfaces of the sealed case of the module, typically through its sidewalls. Circuits boards received within the module thereby are connected through the contact pins to the exterior circuits. In another embodiment, the case of the module affords openings in the sidewall on which corresponding circuit boards are received, in sealed relationship, with the surface of the circuit board on which elements are mounted disposed to the interior, cooling chamber of the module; contact pins extend through hermetic seals from the interior surface to the exterior surface of each circuit board and are accessible at the exterior of the module case. Such circuit boards are conveniently assembled into the modules in the manufacture of equipment and/or systems.

These and other objects and advantages of the present invention will become more apparent from the following detailed description taken in conjunction with the accompanying drawings which form a part thereof; and wherein like reference numerals refer to like parts, throughout.

DETAILED DESCRIPTION OF THE PREFERRED EMBODIMENTS

Figure 2:
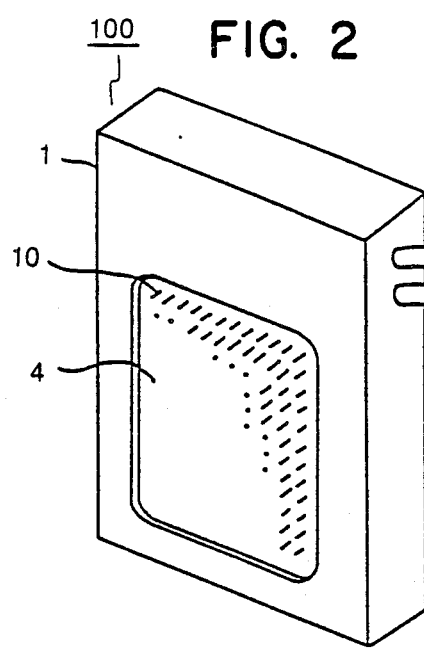
FIG. 2 is a schematic, perspective view of a liquid immersion cooling module in accordance with the present invention.
Figure 3:
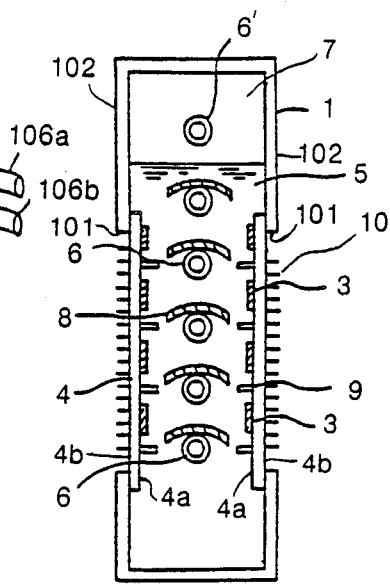
FIG. 3 is a schematic, elevational view, partly in cross-section, of the cooling module of the present invention in accordance with FIG. 2.

The improved evaporation cooling module 100 of the present invention is shown in a schematic, perspective view in FIG. 2 and in a schematic, elevational view in FIG. 3, shown partially in cross-section and taken along a plane extending perpendicularly to the larger, parallel planar surfaces of the module 100 as seen in FIG. 2. The module 100 comprises a case 1, preferably of metal, having openings 101 of generally rectangular configuration in its opposite, major sidewalls 102. The circuit boards 4 are positioned so as to enclose the corresponding openings 101 and are secured and hermetically sealed to the corresponding sidewalls 102.

Figure 3A:
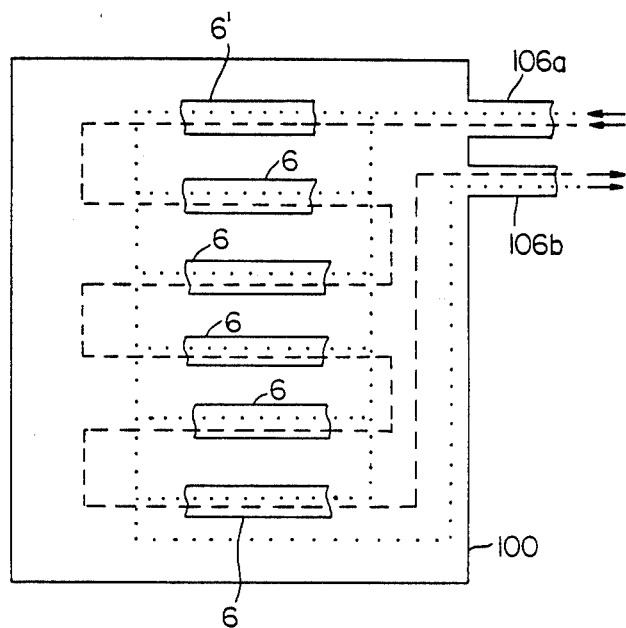
FIG. 3A is a schematic view illustrating connection of the inlet and outlet coolant pipes with the heat exchanges according to the present invention FIG. 4 comprises a portion of the view of FIG. 3, on an enlarged scale, indicating furthermore the convection flow paths of liquid coolant as are produced therein by the improved structure of the present invention.

Each of the ceramic circuit boards 4, typically comprising multilayered printed circuit boards, has mounted on its interior planar surface a plurality of IC chips 3; plural contact pins 10 are connected to the IC chips 3 and extend in hermetically sealed relationship through the corresponding boards 4 from the interior surfaces 4a to the exterior surfaces 4b thereof, for electrically connecting the interior-positioned IC chips 3 to desired exterior circuits and related equipment. As seen in FIG. 3, the interior surfaces 4a of the circuit boards 4 and the associated IC chips 3 are immersed in a liquid coolant 5 which has an upper level defining thereabove an open, upper space 7. Inlet and outlet pipes 106a and 106b, respectively, shown in FIG. 2, provide for a flow of secondary coolant through a plurality of heat exchangers disposed within the case 1 and seen in FIG. 3 to comprise plural heat exchangers 6 immersed within the coolant 5 and a further heat exchanger 6' disposed within the upper space 7. As seen in FIG. 3A, the inlet and outlet pipes, 106a and 106b, respectively, are connected to the heat exchangers 6 and 6' in, e.g., a series as indicated by the dashed line or in parallel as indicated by the dotted line. The secondary coolant which flows through the heat exchangers 6 and 6' may be chilled water, which is readily available, or any other suitable secondary coolant selected in accordance with temperature design and economy considerations.

In accordance with the present invention, bubble traps 8 are respectively associated with the immersed heat exchangers 6, as seen in FIG. 3, and function to collect evaporated, gaseous coolant bubbles and bring them into intimate contact with the respective heat exchangers 6. Thus, most of the evaporated coolant bubbles are condensed and reliquified by the heat exchangers 6, and only a small portion of the gaseous coolant bubbles reaches the surface of the liquid coolant 5; that small portion of the bubbles which reaches the surface and escapes into the space 7 is reliquified by the heat exchanger 6' disposed within the upper space 7.

Figure 1:
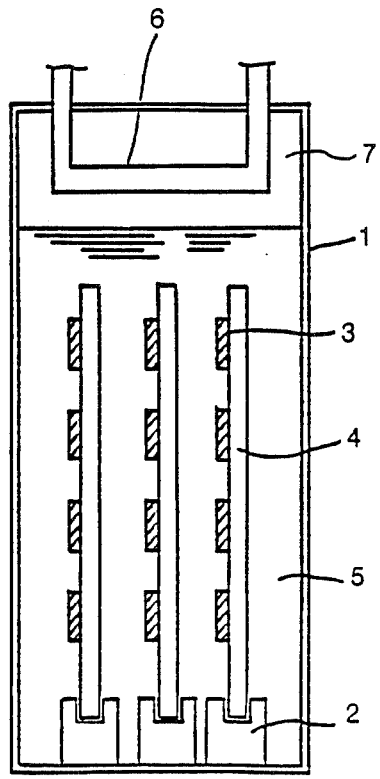
FIG. 1 is a schematic, vertical elevational view, partly in cross-section, of a prior art, liquid immersion cooling module or chamber.

The precise physical configuration of the bubble traps 8 is not critical; in general, they may have a downwardly concave cross-sectional configuration, as shown in FIG. 3, and be of a length corresponding substantially to that of each of the respectively associated heat exchangers 6, thereby to collect the bubbles and concentrate them in the vicinity of the respective heat exchangers 6. Varying specific cross-sectional configurations, or shapes of the traps 8 do not reveal any significant differences in their effectiveness of trapping the bubbles and enhancing the efficiency of reliquification. However, it has been determined by experiments that the material from which the traps 8 are made should be porous, the pores being in the range of approximately 0.5–0.6 mm in diameter. Experiments by which this range of sizes was determined are discussed subsequently, with respect to FIG. 5. The reason that the porous characteristic of the material of the traps 8 is important, while not perfectly clear, is considered to be explained by the following considerations. If the traps 8 are made of a nonporous material, the resulting condition relative to each trap is somewhat similar to that of the prior art structures as discussed with reference to FIG. 1—i.e., in addition to the evaporated coolant bubbles, the released gases, such as air and water vapor, also are collected beneath the individual traps 8, creating the same problems as exist in the prior art structure of FIG. 1 with respect to the space 7 surrounding the heat exchanger 6. However, by fabricating the traps 8 of a porous material of the correct pore size, the released gases, as distinguished from the evaporated coolant bubbles, are permitted preferentially to escape to the upper space 7. Conversely, if the pore diameter is too great, the coolant bubbles as well pass through the trap 8 and thus the beneficial effect of the traps 8 is lost. The preferred porosity (i.e., the diameters of the pores) will depend on the particular viscosity of the liquid coolant, the size of the evaporated coolant bubbles, pressure, and related parameters. The preferred size of the pores, therefore, is such that the pores are small enough to prevent leakage therethrough of the evaporated coolant bubbles, but large enough to pass the released gases.

Preferably, the material selected for the bubble trap should have good heat conductivity. Metals such as copper, aluminum and nickel have been utilized, with no significant differences between them having been recognized. A commercially available porous metal suitable for fabricating the traps 8 is sold under the trade name "Celmet" (manufactured by Sumitomo Denko), and has a sponge-like appearance.

The structure of a liquid immersion coolant chamber, or module, in accordance with the present invention, achieves high efficiency of both evaporation cooling and of reliquification, since the coolant bubbles contact the surface of the heat exchangers, even though the latter are immersed in the coolant. Degradation of the efficiency of the cooling function by released gases surrounding the heat exchangers of prior art structures is avoided in accordance with the invention, since the heat exchangers are immersed in the liquid coolant and the porous bubble traps of the invention maintain the coolant bubbles in surrounding relationship with the respective heat exchangers, while preferentially permitting the released gas to pass therethrough and not accumulate around the associated heat exchangers. Performance of the degassing process, as required frequently in the prior art structures, therefore is unnecessary over extended periods of operation, affording much reduced maintenance requirements.

Figure 5:
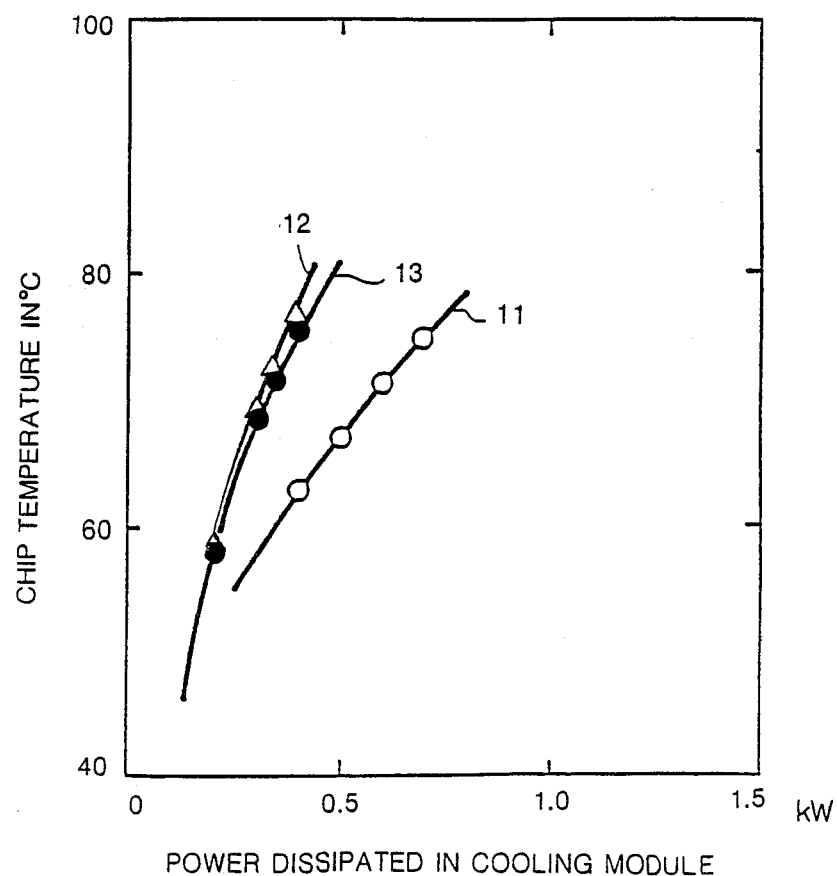
FIG. 5 comprises a graph of plotted data of chip temperature as a function of dissipated power, indicating the improved cooling efficiency achieved by the bubble traps of the present invention.

The effect of the bubble traps 8 of the present invention, as employed for IC chip cooling as above described, is demonstrated in the graph of FIG. 5. In FIG. 5, power (kW) dissipated in the cooling module 100 is plotted on the abscissa and the corresponding chip temperature is plotted in degrees centigrade (°C.) on the ordinate, for a circuit board having numerous IC chips thereon and immersed in a liquid coolant. The data points in each of curves 11, 12 and 13 represent actual measured chip temperature as a function of the power dissipated in the cooling module.

The curve 12, having triangular data points, represents the temperature variations of an IC chip on a circuit board when cooled in a module lacking the bubble traps of the present invention. Curve 11, having the open circular data points, corresponds to the same circuit board but when cooled in a module employing the bubble traps of the present invention. As FIG. 5 demonstrates, the heat dissipation function is improved by nearly a factor of two (2) as a result of the provision of the bubble traps of the invention.

FIG. 5 also shows the effect of the porosity of the bubble trap material, by way of comparison of curves 11 and 13. In the case of curve 11, the bubble trap material has a porosity of 20 pores per $cm^3$, corresponding to a pore size of approximately 0.5–0.6 mm in diameter. Curve 13 having the black circular data points, by comparison, shows the chip temperature in a module employing bubble traps but wherein the material has a porosity of 10 pores per $cm^3$, corresponding to a pore size of approximately 1.0–1.5 mm diameter. In each instance, and by reference to FIG. 3, measurements were performed while running cooling water at a volumetric rate of approximately 1.0 liters per minute through the series-connected heat exchangers 6 immersed in the liquid coolant 5 and of approximately 0.5 liters per minute through the heat exchanger 6' in the upper space 7. As FIG. 5 readily demonstrates, the bubble trap of a material having a pore size which is too great, i.e., curve 13, provides almost no improvement in the cooling effect. In general, the bubble trap material should have a porosity within a range from about 15 to 50 pores per $cm^3$, to achieve the intended beneficial effect.

Figure 4:
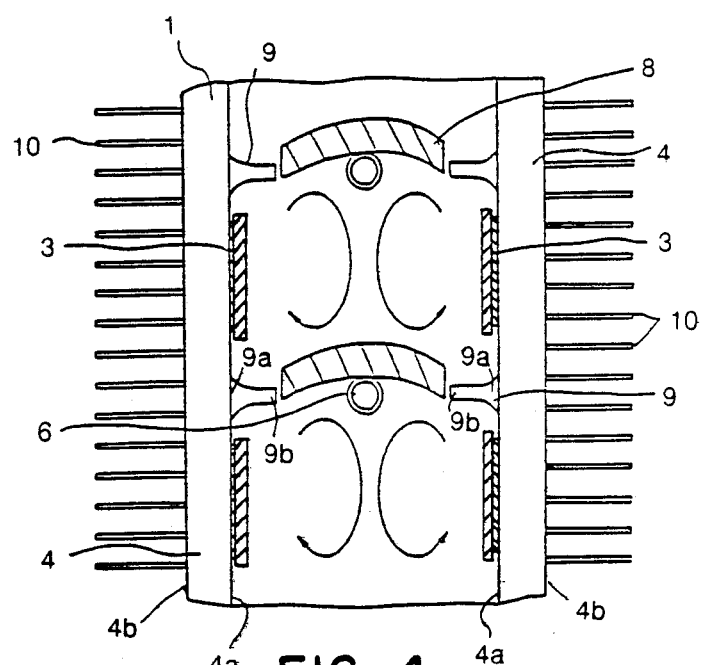

In accordance with a further feature of the improved cooling chamber structures of the present invention, and with reference again to FIG. 3, bubble guides 9 are provided, extending laterally inwardly from the circuit boards 4 and disposed intermediate respective upper and lower rows of IC chips 3. FIG. 4, comprising an enlarged, generally central portion of the structure of FIG. 3, illustrates more specifically the configurations of and relationships between a given heat exchanger 6 and its respectively associated bubble traps 8 and bubble guides 9. It will be understood that the traps 8 and guides 9 extend longitudinally, (i.e., into the plane of the paper) in the views of FIGS. 3 and 4, and have enlarged, outer longitudinal edges 9a contiguous with, and at which they are mounted to, the interior surfaces 4a of the corresponding circuit boards 4, intermediate the respective, upper and lower rows of IC chips 3. The inner longitudinal edges 9b of the guides 9 are relatively narrower in the transverse height dimension and are disposed in alignment with and contiguous to the corresponding and longitudinally extending, opposite edges of the traps 8. Each of the guides 9 thus defines, between its opposite edges 9a and 9b, a flared or arcuate guide path extending from the generally planar interior surfaces 4a of the circuit boards 4 and the corresponding parallel surfaces of the IC chips 3, inwardly to the concave trapping surface of the bubble traps 8. As may be appreciated by consideration of the structure of FIG. 3 and/or FIG. 4, in the absence of the bubble guides 9, the evaporated coolant bubbles, which are produced as the coolant 5 moves by convection along the surface of the chips 3 and of the circuit board 4, will result in progressively poorer contact between the liquid coolant and the chips 3 located in the correspondingly higher portions of the circuit boards 4, with the result that the latter receive a decreased cooling effect. Thus, the bubble guides 9 serve not only to separate the evaporated coolant bubbles from the surfaces of the chips 3 and guide them smoothly into the respective bubble traps 8, such that the bubbles produced in the function of cooling the IC chips 3 of a given row are substantially all collected and maintained in intimate contact with the corresponding heat exchangers 6, they also minimize the number of bubbles which pass vertically upwardly and through the upper surface of the liquid coolant 5 into the open space 7. Accordingly, the guides 9 provide a significant increase in the effectiveness of the reliquification function.

As shown in FIG. 4 by the pair of clockwise and counterclockwise arrows within the space beneath each of the traps 8, the motion of the coolant bubbles produces a local convection current of the coolant 5, which further increases the cooling efficiency achieved by the heat exchangers 6 and improves uniformity of the temperatures experienced by the circuit boards 4 and the devices 3 mounted thereon. In the absence of the bubble guides 9, the coolant flow would proceed through a long circulating loop extending from the bottom of the case 1 to the surface of the liquid coolant 5, producing the aforenoted, undesirable temperature distribution or gradient along the height dimension of the circuit board 4. Because of the accumulation of the evaporated coolant bubbles at the upper portions of the circuit board in such a long circulating loop, the cooling effect at those same upper portions is relatively decreased and the temperature of the IC chips 3 mounted thereon is higher in comparison to those at lower elevational positions on the circuit boards 4. These flow patterns have been observed by construction of a cooling module having a case made of a transparent, plastic resin.

Figure 6:
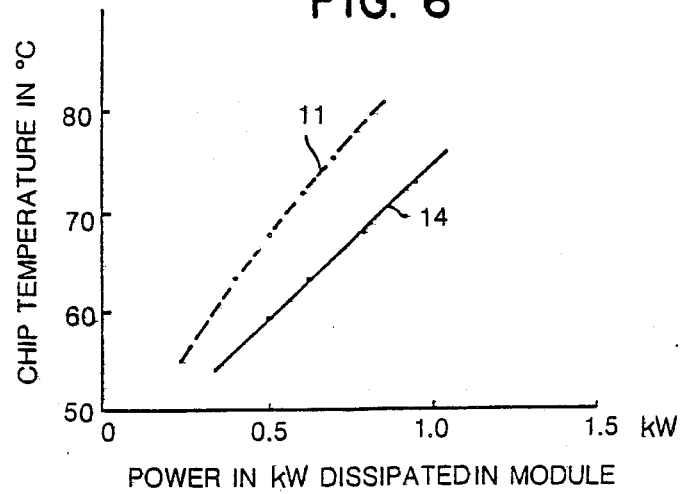
FIG. 6 is a graph of plotted data of chip temperature as a function of dissipated power, indicating the improvement of reduced chip temperature afforded by the bubble guides of the present invention.

The graph of FIG. 6, containing data plots of the temperature (°C.) of the IC chips 3 along the abscissa, as a function of the power (kW) dissipated within the module by the elements mounted on the circuit boards, shows the beneficial effect of the provision of the bubble guides 9. Particularly, curve 11, defined by data points as explained in reference to FIG. 5, is reproduced in FIG. 6 and represents the temperature to power, relationship for a circuit board without bubble guides. Similarly, curve 14 represents the temperature to power relationship of a module incorporating the bubble guides of the present invention. As clearly illustrated, the chip temperature is significantly reduced for corresponding levels of dissipated power through the provision of the bubble guides.

Although the cooling case 1 may be made of any suitable material, it preferably is made of metal, since the elasticity of metal mitigates against deformation of the module as might otherwise be produced by temperature and pressure variations. The configuration and arrangement of the cooling case 1 as shown in FIGS. 2 and 3, for example, moreover is convenient for use in a large system, such as a large computer. As is apparent, each module 100 may comprise two circuit boards 4, respectively having a plurality of IC chips 3 on their inner surfaces 4a which are connected to coupling pins 10 which extend in opposite directions from the respective opposite exterior surfaces 4b of the circuit boards 4 and which may function as wiring pins for the elements, including the chips 3, on the board 4. They thus function as the conventional contact pins of an ordinary circuit board. Accordingly, the modules 100 may be handled as otherwise ordinary circuit boards, albeit of somewhat greater thicknesses. Nevertheless, the total thickness of two circuit boards 4 mounted within a module 100 in accordance with the invention is less than that required for a circuit board of corresponding capacity but employing alternative cooling methods of the prior art, in view of the great cooling efficiency achieved by the cooling modules having the structures of the present invention. The reduction in size of the individual modules, of course, contributes to a reduction in size of the total system.

Figure 7:
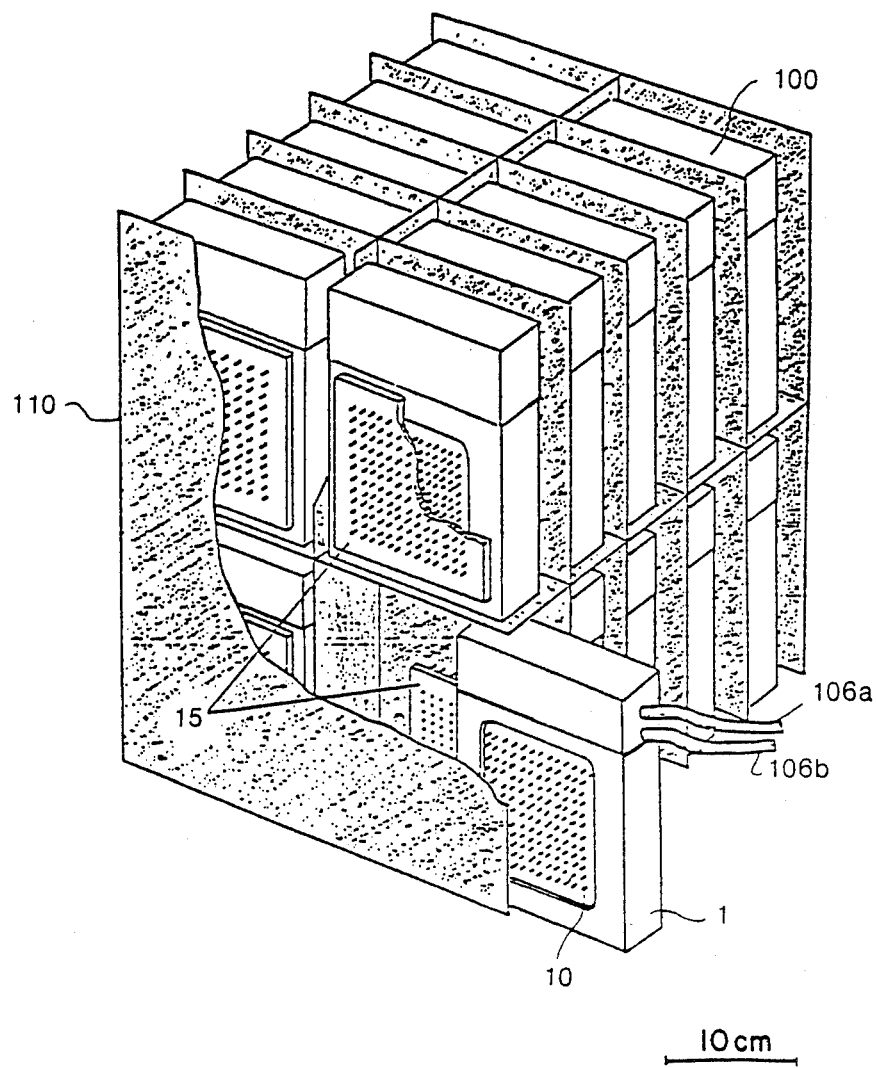
FIG. 7 is a schematic, perspective view, illustrating an assemblage of plural cooling modules in accordance with the present invention into a rack or cabinet.

FIG. 7 is a schematic, isometric view of an assemblage of a plurality of cooling modules 100 in accordance with the invention, stacked in a rack or cabinet 110. High density connectors 15 are positioned so as to be aligned with the pins 10 extending from the opposite surfaces of the case 1 of each module 100 when in position, and provide for suitable interconnections in accordance with conventional circuit board assembly techniques. Inlet and outlet coolant pipes 106a and 106b are illustrated for one of the modules 100 but connection thereof to exterior cooling water pipes is omitted since the figure is merely intended as illustrative and such further connections may be of conventional type.

Figure 8:
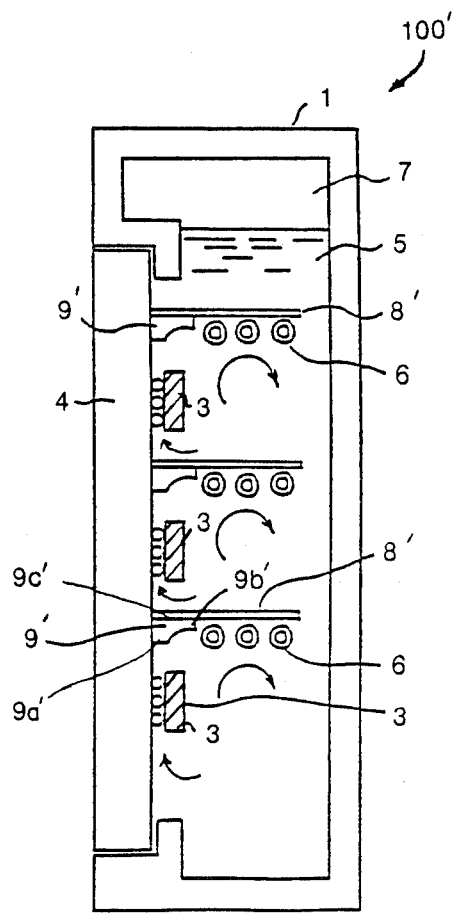
FIG. 8 is a schematic, elevational view, partly in cross-section, of a cooling module in accordance with a second embodiment of the present invention, incorporating an alternative arrangement of bubble traps, bubble guides and heat exchangers.

The particular structure of the cooling module 100 of FIGS. 3 and 4 may be modified, while still retaining the benefits of the invention as hereinbefore described. FIG. 8 illustrates a further embodiment of the invention in accordance with such possible modifications, wherein only a single circuit board 4 is mounted within the case 1 of a cooling module 100', affording a configuration suitable for components, such as IC chips 3, which consume relatively high levels of power and correspondingly dissipate substantial heat. For simplicity of illustration in FIG. 8, contact pins 10 and a heat exchanger 6' within the space 7, as shown in FIGS. 3 and 4, are omitted. In view of the heat dissipation requirement contemplated for the structure of FIG. 8, the IC chips 3 are bonded in displaced relationship from the corresponding circuit board 4 to provide a gap therebetween, permitting the flow of coolant 5 over both the front and back major surfaces of the chips 3 to afford cooling from both thereof. Such bonding arrangements are conventional and known as flip chip bonding, for example. Bubble guides 9' may have a lower arcuate surface extending between the enlarged edges 9a' mounted to the board 4 and the reduced interior edges 9b, and may have flat upper surfaces 9c' which provide mounting surfaces for the bubble traps 8'. In this embodiment, the traps 8' are of enlarged lateral dimensions so as to accommodate therebeneath plural heat exchangers 6, shown as three in number, associated with each row of IC chips 3. The arrows illustrate the local convection currents, the coolant liquid 5 proceeding over both the front and back faces of the IC chips 3. The cooling effect and the benefits of the invention as heretobefore described apply as well to the structure of FIG. 8.

Figure 9:
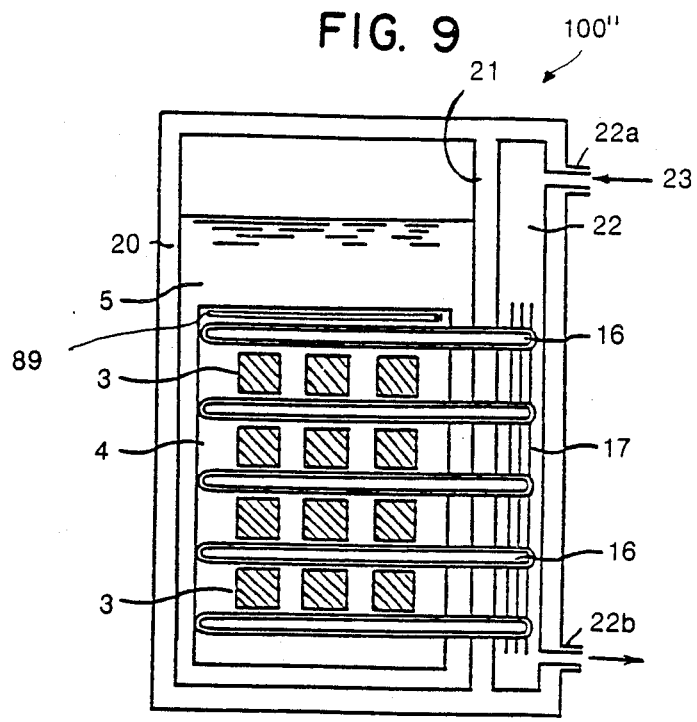
FIG. 9 is a schematic, elevational view, partially in cross-section, of a third embodiment of a cooling module in accordance with the present invention, employing alternative heat pipe structures as heat exchangers.

FIG. 9 is a schematic, elevational view of a third embodiment of the present invention. The module 100" comprises a main cooling chamber 20 containing therewithin a liquid coolant 5 within which is immersed a circuit board 4 and a plurality of IC chips 3, arranged in plural rows. The heat exchanger 16 in this embodiment comprise heat pipes of conventional type, and which function as the heat exchanger 6 of the preceding embodiments. The heat pipes 16 are disposed intermediate respective upper and lower rows of IC chips 3 on the circuit board 4 and accordingly are submersed within the coolant of the main chamber 20, and extend through a dividing wall 21, in sealed relationship therewith, to a subsidiary cooling chamber 22, the portions 16' of the heat pipes therewithin having fins 17 of conventional type mounted thereon. A secondary coolant 23 is introduced into the subsidiary cooling chamber 22 through an inlet 22a so as to pass over the fins 17 and the portions 16' of the pipe 16 therewithin and exit from the outlet 22b. Element 89 indicates schematically the provision of the combination of a trap 8' and a bubble guide 9' as in the structure of FIG. 8, disposed in association with each of the heat pipes 16; alternatively, element 89 may represent the corresponding structure of traps 8 and guides 9 of FIGS. 3 and 4. It is understood that the guide and trap structure 89 is provided for each of the heat pipes 16 in FIG. 9. The volumetric level of flow of secondary coolant 23, typically chilled water, and its pressure are chosen in accordance with conventional considerations, to be appropriate for the heat transfer function between the main and subsidiary cooling chambers 20 and 22.

Figure 10:
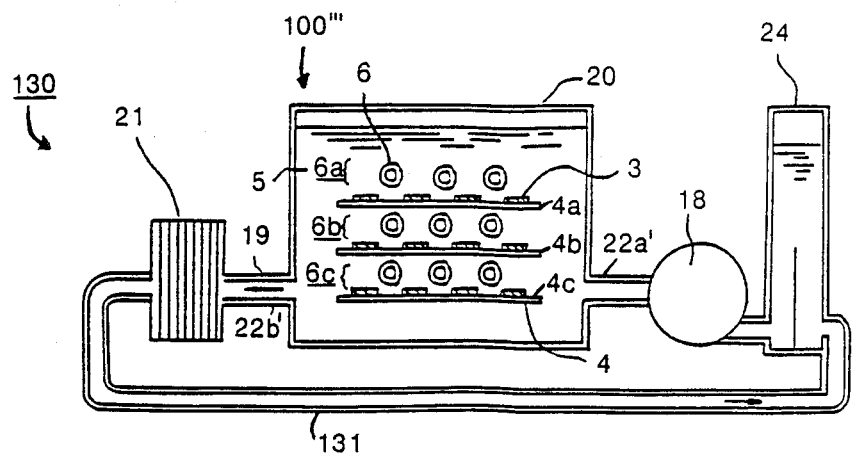
FIG. 10 is a schematic, elevational view, partly in cross-section, illustrating a fourth embodiment of the cooling module of the present invention, as incorporated in a system employing forced circulation of the liquid coolant.

FIG. 10 is a schematic, elevational view, partially in cross-section, of a module 100''' in accordance with a fourth embodiment of the present invention, suitable for incorporation in a system 130. The module 100''' comprises a main cooling chamber 20 containing a liquid coolant 5 therewithin, the latter being circulated by a pump 18 to pass from the chamber 100''' through outlet 22b', as shown by the arrow therein, into an external heat exchanger 21, and thereafter through a return conduit 131 to a gas extractor 24 in which any released gas present in the coolant 5 is extracted. Pump 18 pressurizes the liquid coolant from the gas extractor 24 and returns the liquid coolant through inlet 22a' to the main cooling chamber 20. The heat exchangers 6 with the module 100''' supplement the primary reliquification function performed by the external heat exchanger 21 and significantly, correct for a deficiency which otherwise would exist if only the external heat exchanger 21 were employed, as occurs in prior art systems. Particularly, the system 130 provides forced circulation of the liquid coolant 5 by virtue of utilizing the pump 18; thus, within the module 100''', the required circulation of the coolant 5 over the IC chips 3 mounted on the circuit boards 4 does not depend on convection currents. However, if sufficient heat dissipation occurs with resultant, relatively high levels of evaporation of the coolant 5, a thermal difference may develop between the upstream and downstream regions of the circuit boards 4 and the correspondingly positioned IC chips 3 mounted thereon, i.e., regions with reference to the flow of the coolant 5 from the inlet 22' and through the internal chamber of the module 100' and across the IC chips 3 to the outlet 22b'. The module 100''' corrects for this problem, employing to advantage the function of the bubble traps 8 and 8' of the embodiments of the preceding figures; due to the lateral flow of coolant 5 through the module 100''', the function of bubble guides 9 and 9' of the embodiments of the preceding figures, however, is not required. Specifically, the circuit boards 4, more specifically designated as vertically spaced circuit boards 4a, 4b and 4c, in descending vertical order, are oriented so as to position their respective IC chips 3 and corresponding mounting surfaces in a vertically upward direction so as to associate same with the respective, vertically displaced rows of heat exchangers 6a, 6b and 6c. The bottom surfaces of the circuit boards 4a and 4b serve to trap the gaseous bubbles of evaporated coolant and maintain same in close contact with the respective, underlying rows of heat exchangers 6b and 6c. This function of the circuit boards 4a and 4b thus corresponds substantially to the function of the separately provided bubble traps 8' in relation to the respectively associated, plural heat exchangers 6 in the embodiment of FIG. 8. The upper row of heat exchangers 6a has no corresponding bubble trap configuration; however, the same may readily be provided either through the provision of another planar trap as shown at 8' in FIG. 8, or by a series of downwardly concave traps 8 as shown in FIGS. 3 and 4 associated with the individual heat exchangers 6a. The provision of bubble traps for the upper row of heat exchangers 6a, however, is not essential inasmuch as the gaseous bubbles of evaporated coolant may be permitted to escape and be reliquified by the coolant 5 and/or passed therewith by forced circulation to the external heat exchanger 21 for reliquification.

In accordance with the foregoing, the cooling modules of the various different embodiments of the present invention provide improved efficiency of cooling of the chips immersed in the coolant, through the provision of bubble traps and bubble guides associated with the respective heat exchangers. The adverse effects of released gas as occur in prior art structures are eliminated by immersing the heat exchangers in the liquid coolant. Thus, maintenance of the cooling system is simplified and, in the system of FIG. 10, the process of degassing may be eliminated entirely.

Various modifications and adaptations of the cooling module of the present invention will be apparent to those of skill in the art and thus it is intended by the appended claims to encompass all such modifications and adaptations of the present invention as fall within the true spirit and scope of the appended claims.

What is claimed is:

1. A module for evaporation cooling of a plurality of semiconductor chips mounted on a common, generally planar surface of a circuit board and immersed in a liquid coolant contained within the module, said liquid coolant including, during cooling, a first gas of bubbles of evaporated coolant and a second gas such as air, comprising:

(a) a case forming a chamber and having at least one sidewall with an opening formed therein in communication with said chamber, said sidewall being adapted for receiving a planar circuit board thereon in hermetically sealed relationship for closing said opening and with the common, generally planar surface thereof disposed inwardly with respect to said chamber for positioning the plurality of semiconductor chips mounted thereon within said chamber, said case, with said opening enclosed by the circuit board, defining a sealed interior cooling chamber for receiving sufficient liquid coolant therewithin to immerse the plurality of semiconductor chips within the liquid coolant;

(b) at least one heat exchanger within the liquid coolant and mounted at a predetermined position within said cooling chamber, adjacent corresponding, immersed semiconductor chips of a plurality thereof mounted on the circuit board enclosing the sidewall openings of the case, for cooling the liquid coolant and reliquifying the first gas; and (c) porous metal means associated with each said heat exchanger and immersed within the coolant, for trapping the first gas, allowing the second gas to pass therethrough, and maintaining contact of the first gas with said associated heat exchanger.

2. An evaporation cooling module as recited in claim 1, wherein:

each said trapping means is disposed in superposed relationship with the respectively associated heat exchanger.

3. An evaporation cooling module as recited in claim 2, further comprising:

(d) means associated with each said bubble trapping means, immersed within the coolant and mounted within said cooling chamber, for guiding said first gas toward said associated trapping means.

4. An evaporation cooling module as recited in claim 3, wherein:
   each said heat exchanger is of elongated configuration and extends longitudinally within said cooling chamber for a predetermined distance;
   each said trapping means is of elongated configuration and extends longitudinally within said chamber for a substantially corresponding said distance; and
   each said guiding means is of elongated configuration and extends longitudinally within said chamber for a substantially corresponding said distance.

5. An evaporation cooling module as recited in claim 4, wherein:
   each said bubble trapping means is of a longitudinally extending, downwardly concave configuration.

6. An evaporation cooling module as recited in claim 1, wherein said porous metal has a porosity within the range of approximately 15 to 50 pores per cm$^3$.

7. An evaporation cooling module as recited in claim 4, wherein the plurality of semiconductor chips is mounted on a common, generally planar surface of a circuit board in vertically spaced, longitudinal rows, and wherein:
   each said bubble guiding means includes inner and outer longitudinal edges, the outer longitudinal edge being adapted to be secured to the common, generally planar surface of a circuit board intermediate vertically spaced rows of semiconductor chips, each said bubble guiding means extending laterally inwardly within said chamber for positioning the inner longitudinal edge thereof adjacent a corresponding longitudinal edge of said associated trapping means.

8. An evaporation cooling module as recited in claim 7, wherein:
   said case has first and second, generally parallel sidewalls having corresponding first and second openings therein, adapted for receiving respective, first and second circuit boards thereon in hermetically sealed relationship for closing said respective first and second openings and with the common, generally planar surfaces of the circuit boards disposed inwardly with respect to said chamber for positioning corresponding first and second pluralities of semiconductor chips, mounted in corresponding, vertically spaced rows thereon, within said chamber;
   plural said heat exchangers are mounted at respective, vertically spaced positions so as to be adjacent to respective, corresponding and vertically spaced rows of semiconductor chips of first and second circuit boards enclosing said sidewall openings of said case;
   said trapping means including plural bubble traps positioned in respective, superposed relationship with said heat exchangers; and
   said bubble guiding means including first and second elongated bubble guides associated with each said bubble trap, the outer longitudinal edges of each of said first and second bubble guides being adapted to be secured to the common generally planar surfaces of respective first and second circuit boards, intermediate corresponding, vertically spaced rows of semiconductor chips thereon, so as to extend laterally inwardly within said chamber for positioning the corresponding inner longitudinal edges of said first and second bubble guides adjacent the corresponding, opposite longitudinal edges of said associated bubble trap.

9. An evaporation cooling module as recited in claim 1, wherein:
   each said bubble trapping means is associated with a group of plural said heat exchangers and disposed in superposed relationship therewith.

10. An evaporation cooling module as recited in claim 9, wherein:
    each said bubble trapping means is of elongated, longitudinal configuration having spaced, first and second longitudinally extending edges;
    each said bubble guide means is of an elongated, longitudinally extending configuration having inner and outer, spaced longitudinal edges and is attached at the inner longitudinal edge thereof to a circuit board, intermediate adjacent, vertically spaced and longitudinally extending rows of semiconductor chips mounted thereon.

11. An evaporation cooling module as recited in claim 10, wherein each said bubble trapping means is secured along the inner longitudinal edge thereof to a corresponding said long,itudinally extending bubble trapping means.

12. An evaporation cooling module as recited in claim 1, wherein:
    said case further defines a subsidiary cooling chamber having an inlet and an outlet for circulation of a secondary coolant therethrough;
    each said heat exchanger comprises a heat pipe having a first portion in said interior cooling chamber and a second portion in said subsidiary chamber and extending in hermetically sealed relationship between said interior cooling chamber and said subsidiary chamber, the secondary coolant in said subsidiary chamber passing over said second portion of each said heat pipe in heat exchange relationship therewith.

13. An evaporation cooling module for evaporation cooling of plural semiconductor chips mounted on a common, generally planar surface of a circuit board and immersed in a liquid coolant contained within the module, said liquid coolant including, during cooling, a first gas of bubbles of evaporated coolant and a second gas such as air, comprising:
    (a) a case defining an interior cooling chamber and having at least one sidewall defining an opening therein in communication with said chamber;
    (b) at least one circuit board having a plurality of semiconductor chips mounted thereon in plural, generally vertically spaced and longitudinally extending rows of plural semiconductor chips each, said circuit board being mounted in hermetically sealed relationship on said sidewall so as to enclose said opening, said case thereby defining a sealed interior cooling chamber for receiving sufficient liquid coolant therein to immerse the plurality of semiconductor chips;
    (c) plural, and longitudinally extending heat exchangers immersed in the coolant and positioned in vertically spaced relationship corresponding to said vertically spaced rows of said semiconductor chips;
    (d) plural, longitudinally extending, porous metal, bubble traps respectively corresponding to said plural heat exchangers and mounted in superposed relationship with respect to the corresponding said heat exchangers and immersed in the coolant, each said bubble trap trapping the first gas, allowing the second gas to pass therethrough, and maintaining the first gas in contact with said respectively corresponding heat exchanger.

14. An evaporation cooling module as recited in claim 13, further comprising:
(e) a plurality of longitudinally extending bubble guides, each having inner and outer longitudinal edges, and each being mounted at its outer longitudinal edge to a circuit board, intermediate a corresponding pair of vertically spaced rows of plural semiconductor chips and extending laterally inwardly within said chamber to dispose the inner longitudinal edge thereof adjacent the corresponding longitudinal edge of said bubble trap of said respectively corresponding heat exchanger.

15. An evaporation cooling module as recited in claim 14, wherein said porous metal has a porosity within the range of approximately 15 to 50 per cm$^3$.

16. An evaporation cooling module as recited in claim 13, wherein:
each said bubble trap means is associated with a group of plural said heat exchangers and disposed in superposed relationship therewith.

17. An evaporation cooling module as recited in claim 13, wherein:
said case includes at least first and second spaced, parallel sidewalls defining corresponding first and second openings therein and receiving in hermetically sealed relationship therewith, respectively corresponding first and second circuit boards each having inner and outer surfaces and mounted on said respective first and second sidewalls so as to dispose said inner surfaces thereof toward said interior cooling chamber for positioning the respective pluralities of said semiconductor chips mounted thereon within said cooling chamber.

18. An evaporation cooling module as recited in claim 17, wherein:
each of said bubble guides has a pair of spaced, longitudinally extending edges;
each of said circuit boards includes a plurality of longitudinally extending bubble guides mounted thereon intermediate corresponding and adjacent, vertically spaced rows of semiconductor chips; and
said respective bubble guides of said first and second circuit boards extend laterally inwardly so as to dispose the corresponding inner edges thereof adjacent the respective, spaced longitudinal edges of a respectively corresponding said bubble trap.

19. An evaporation cooling module for evaporation cooling of plural semiconductor chips mounted on a common, generally planar surface of at least one circuit board and immersed within the liquid coolant contained within the module, comprising:
(a) a case defining an interior cooling chamber and an inlet and an outlet for circulation of liquid coolant therethrough;
(b) at least one circuit board positioned horizontally within said case and immersed in the coolant;
(c) plural heat exchangers positioned within said case in parallel relationship to said at least one circuit board and immersed in said coolant, at least one of said plural heat exchangers being positioned beneath a corresponding said circuit board in spaced relationship therewith such that said circuit board traps gaseous bubbles of evaporated coolant and maintains same in the vicinity of said at least one heat exchanger; and
(d) an exterior pump connected in a closed fluid circulation path between said inlet and said outlet of said case for circulating coolant through said case.

20. An evaporation cooling module as recited in claim 19, wherein there is further provided:
an exterior heat exchanger in said circulation path.

21. An evaporation cooling module as recited in claim 20, wherein there is further provided:
degassification apparatus connected in said circulation path.

22. A module for evaporation cooling of a plurality of semiconductor chips mounted on a common, generally planar surface of a circuit board and immersed in a liquid coolant contained with the module, said liquid coolant including, during cooling, a first gas of bubbles of evaporated coolant and a second gas such as air, comprising:
(a) a case defining a chamber and for mounting the circuit board so as to position at least the plurality of semiconductor chips mounted thereon within said chamber and being hermetically sealed for receiving sufficient liquid coolant therewithin to immerse the plurality of semiconductor chips with the liquid coolant;
(b) at least one heat exchanger mounted at a predetermined position within said cooling chamber, immersed within the liquid coolant and adjacent corresponding, immersed semiconductor chips of the plurality thereof, for cooling the liquid coolant and reliquifying the first gas; and
(c) porous metal means associated with each said heat exchanger and immersed within the coolant for trapping the first gas, allowing the second gas to pass therethrough, and maintaining contact of the first gas with said associated heat exchanger.

23. An evaporation cooling module as recited in claim 22, wherein:
each said trapping means is disposed in superposed relationship with the respectively associated heat exchanger.

24. An evaporation cooling module as recited in claim 23, wherein:
at least first and second circuit boards are positioned in parallel, spaced relationship within said module;
each said heat exchanger is mounted vertically above and closely adjacent to a corresponding said circuit board; and
said trapping means, for each said heat exchanger disposed between first and second vertically spaced circuit boards comprises the respective, vertically superposed said circuit board.

* * * * *